(12) United States Patent
Handa et al.

(10) Patent No.: US 7,940,512 B2
(45) Date of Patent: *May 10, 2011

(54) ELECTROSTATIC CHUCK

(75) Inventors: Ryuichi Handa, Gunma (JP); Akio Nakano, Gunma (JP); Ikuo Sakurai, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 335 days.

This patent is subject to a terminal disclaimer.

(21) Appl. No.: 12/108,650

(22) Filed: Apr. 24, 2008

(65) Prior Publication Data

US 2008/0266746 A1    Oct. 30, 2008

(30) Foreign Application Priority Data

Apr. 26, 2007 (JP) .................. 2007-117411

(51) Int. Cl.
*H01T 23/00* (2006.01)
(52) U.S. Cl. ...................................... 361/234
(58) Field of Classification Search .............. 361/234
See application file for complete search history.

(56) References Cited

U.S. PATENT DOCUMENTS

| 6,166,897 | A | 12/2000 | Matsunaga | |
|---|---|---|---|---|
| 6,369,155 | B1 | 4/2002 | Takita | |
| 6,760,214 | B2 * | 7/2004 | Tomaru et al. | 361/234 |
| 7,352,555 | B2 * | 4/2008 | Handa et al. | 361/234 |
| 7,667,943 | B2 * | 2/2010 | Nakano et al. | 361/234 |
| 2004/0235994 | A1 | 11/2004 | Okamoto | |
| 2004/0242762 | A1 | 12/2004 | Horikoshi | |
| 2006/0079634 | A1 | 4/2006 | Horikoshi | |
| 2006/0120011 | A1 | 6/2006 | Handa et al. | |
| 2007/0072990 | A1 | 3/2007 | Okamoto | |
| 2007/0173595 | A1 | 7/2007 | Tsuji | |
| 2008/0045649 | A1 | 2/2008 | Okamoto | |
| 2008/0305294 | A1 | 12/2008 | Okamoto | |
| 2009/0176930 | A1 | 7/2009 | Okamoto | |

FOREIGN PATENT DOCUMENTS

EP    1 850 376 A    10/2007

(Continued)

OTHER PUBLICATIONS

"International Search Report," International Application No. EP 08 25 1479, date of completion Sep. 17, 2008, place of search Munich, 2 pages.

(Continued)

*Primary Examiner* — Stephen W Jackson
(74) *Attorney, Agent, or Firm* — Millen, White, Zelano & Branigan, P.C.

(57) ABSTRACT

This invention relates to a suitable electrostatic chuck to hold a substrate during the manufacture of a semiconductor integrated circuit having excellent cooling performance and insulation performance, and a low level of particulate generation, which is comprised of an electrostatic chuck, comprising a metal substrate, a first insulating layer of silicone rubber formed directly or via an adhesive layer on the metal substrate and having a thermal conductivity of 0.5 W/mK or more, an electrically conducting pattern formed directly or via an adhesive layer on this first insulating layer, a second insulating layer of an insulating polyimide film formed directly or via an adhesive layer on this electrically conducting pattern, and a third insulating layer formed directly or via an adhesive layer on this second insulating layer, wherein this third insulating layer is a silicone rubber containing reinforcing silica, this layer not containing any thermally conductive filler having an average particle size of 0.5 μm or more.

19 Claims, 2 Drawing Sheets

FOREIGN PATENT DOCUMENTS

| | | |
|---|---|---|
| JP | 6-136271 | 5/1994 |
| JP | 10-209256 | 8/1998 |
| JP | 11-297804 | 10/1999 |
| JP | 2001-2923 | 1/2001 |
| JP | 2002 324834 | 11/2002 |
| JP | 2004 269757 | 9/2004 |
| JP | 2004 331962 | 11/2004 |
| JP | 2004-352947 | 12/2004 |

OTHER PUBLICATIONS

Kazuhiko, et al. "Electrostatic Chuck", Abstract of Japanese Patent Publication 11297804A, Published: Oct. 29, 1999; Assignee: Shinetsu Chemical Co.

Atsushi, et al. "Room Temperature-Curing Type of Thermally Conductive Silicone Rubber Composition", Abstract of Japanese Patent Publication 2004352947A, Published: Dec. 16, 2004; Assignee: Shinetsu Chemical Co.

Hiroaki, et al. "Addition Curing Type Heat Conductive Liquid Silicone Rubber Composition", Abstract of Japanese Patent Publication 2004331962A; Published: Nov. 25, 2004; Assignee: Dow Corning Toray Silicone Co. Ltd.

Tadao, M. "Electrostatic Chuck Device and its Manufacture", Abstract of Japanese Patent Publication 10209256A; Published: Aug. 7, 1998; Assignee: Tomoegawa Paper Co. Ltd.

Kenichi, T. "Fluorosilicone Rubber Composition", Abstract of Japanese Patent 2001002923A; Published: Jan. 9, 2001; Assignee: Shinetsu Chemical Co.

Masaru, et al. "Rubber Member for Gasket", Abstract of Japanese Patent 2004269757; Published: Sep. 30, 2004; Assignee: Uchiyama MFG Corp.

Makoto, S. "Fluorosilicone Rubber Composition", Abstract of Japanese Patent 6136271A; Published: May 17, 1994; Assignee: Toshiba Silicone Co. Ltd.

\* cited by examiner

ELECTROSTATIC CHUCK

FIELD OF THE INVENTION

The present invention relates to an electrostatic chuck used in a process for holding a substrate required in the manufacture of a semiconductor integrated circuit, and in particular, to an electrostatic chuck useful in an ion implantation process, a sputtering process, a plasma etching process, and the like.

BACKGROUND OF THE RELATED ART

In the prior art, an electrostatic chuck known as an electrostatic adsorption wafer chuck is used to hold a substrate during the manufacture of a semiconductor integrated circuit. As an insulating layer of this electrostatic chuck, alumina, aluminum nitride, a ceramic material such as boron nitride, an organic resin such as a polyimide, or a elastic body such as silicone rubber, has been proposed.

In an ion implantation process, it is required to perform ion implantation smoothly wherein the temperature rise of a wafer due to the heat of an ion beam is suppressed, the temperature of the wafer is kept uniform and constant, and there is no heat damage to the wafer. For this purpose, in such an ion implantation process, a platen mechanism for cooling the wafer, wherein a cooling mechanism which circulated a cooling chiller in a cooling channel formed on the back side of the electrostatic chuck or in a plinth, was provided.

For example, it is known that an electrostatic chuck using a ceramic insulating layer has excellent durability and high thermal conductivity. However, since the ceramic insulating layer has a high hardness, it has poor adhesion to a wafer with surface unevenness, and since the contact thermal resistance increases as a result, sufficient heat dissipation is not obtained. Hence, in order to promote heat dissipation, a gas cooling method is adopted wherein an inert gas such as helium is circulated between the wafer and the insulating layer. However, in this method, not only is it necessary to perform fine machining to form a groove in the insulating layer surface through which the inert gas can be passed, but an apparatus is required to supply the inert gas, and since the structure of the electrostatic chuck becomes more complex, there is a disadvantage of increasing the manufacturing cost of the electrostatic chuck. Moreover, since the insulating layer is hard and particles are generated when the wafer is brought into contact and rubs against it, if the wafer is processed with particles still adhering to its back side, defects may occur during the fine machining of the wafer.

Although an electrostatic chuck using an insulating layer made from polyimide can be manufactured easily and is also economical, there is a problem that since it has a low thermal conductivity and is hard, it has a large contact thermal resistance, and heat dissipation properties are poor. Also, as in the case of an electrostatic chuck using a ceramic insulating layer, there is the problem that particles are generated.

An electrostatic chuck has been proposed comprising a first insulating film of a thermally conductive silicone rubber prepreg obtained by impregnating glass cloth with silicone rubber on a metal plate, a copper pattern functioning as an electrode on the first insulating film, and a second insulating layer of silicone rubber formed on the copper pattern (JP-A 59-64245). Since this electrostatic chuck uses silicone rubber which is an elastic body as an insulating layer, its contact thermal resistance is relatively small and heat dissipation properties are good, so it dissipates heat efficiently and tends to keep the temperature of a wafer uniform. Moreover, since silicone rubber is soft, even if it comes in contact with a wafer, it does not easily generate particles, and a low level of particulate generation can be realized. However, in recent years, still higher heat dissipation properties and lower particulate levels are being demanded, and in this respect, the performance of this electrostatic chuck is inadequate.

For this reason, another electrostatic chuck was proposed comprising a first insulating layer of thermally conductive silicone rubber having a thermal conductivity of 0.2 W/mK or more on a metal substrate, an electrically conducting pattern formed as an electrode on this first insulating layer, and a second insulating layer of thermally conductive silicone rubber having a thermal conductivity of 0.2 W/mK or more, a hardness of 85 or less, and a surface roughness of 5 µm or less formed on this electrically conducting pattern. This chuck has superior heat dissipation properties, and is able to keep the wafer temperature uniform and constant to a high degree of precision (JP-A 9-298233). However, in the case of this electrostatic chuck, since sputter metal is introduced, there is concern about insulation abnormalities arising in the second insulating layer. Further, in this electrostatic chuck, there is also concern that thermally conductive fillers such as alumina and boron nitride which are added to impart thermal conductivity to the silicone rubber may drop out, and generate the undesirable particles mentioned hereinabove.

Still another electrostatic chuck has been proposed, comprising a first insulating layer of thermally conductive silicone rubber having a thermal conductivity of 0.2 W/mK or more formed directly or via an adhesive layer on a metal substrate, an electrically conducting pattern formed directly or via an adhesive layer on this first insulating layer, a second insulating layer of an insulating polyimide film formed directly or via an adhesive layer on this electrically conducting pattern, and a third insulating layer formed directly or via an adhesive layer on this second insulating layer, this third insulating layer being of silicone rubber having a thermal conductivity of 0.2 W/mK or more, a hardness of 85 or less and a surface roughness of 5 µm or less. Since it has excellent cooling performance and insulating properties, it has been proposed as suitable for holding a substrate during the manufacture of a semiconductor integrated circuit (JP-A 2006-165160). Since this electrostatic chuck uses an insulating polyimide film for the second insulating layer, there is little possibility of causing insulation abnormalities. However, if the specific surface area of a thermally conductive filler added to the silicone rubber of the third insulating layer is small, there is concern that it will be only weakly integrated with the silicone polymer, and since it has no active sites, which can bind to the silicone polymer, on the surface, particles may be generated. Moreover, the thermally conductive filler is hard and may abrase the wafer by rubbing, which may also generate more particles.

SUMMARY OF THE INVENTION

The Inventors therefore carried out intensive studies to provide an electrostatic chuck of superior cooling performance and insulation performance to that required previously, and which had only a very low level of particulate generation. As a result, it was discovered that a good result could be obtained by making the third insulating layer a silicone rubber layer blended with reinforcing silica, this layer not containing any thermally conductive filler having an average particle size of 0.5 µm or more, and this led to the present invention.

It is therefore an object of the present invention to provide an electrostatic chuck having superior cooling performance, insulating performance and a low level of particulate generation compared to those of the prior art.

According to the present invention, there is therefore provided an electrostatic chuck, comprising a metal substrate, a first insulating layer of silicone rubber formed directly or via an adhesive layer on the metal substrate and having a thermal conductivity of 0.5 W/mK or more, an electrically conducting pattern formed directly or via an adhesive layer on this first insulating layer, a second insulating layer of an insulating polyimide film formed directly or via an adhesive layer on this electrically conducting pattern, and a third insulating layer formed directly or via an adhesive layer on this second insulating layer, wherein this third insulating layer is a silicone rubber containing reinforcing silica, this layer not containing any thermally conductive filler having an average particle size of 0.5 µm or more (Claim 1).

According to the present invention, the third insulation layer preferably has a thickness of 10-150 µm, contains fumed silica (dry silica) having a BET specific surface area of more than 50 $m^2/g$ (Claim 2), a hardness of 50 or more, a tensile strength of 5 MPa or more and a surface roughness of 5 µm or less (Claim 3), and the thickness of the second insulating layer is preferably 5-50 µm (Claim 4).

Among four adhesive layers, at least one adhesive layer is provided, this adhesive layer preferably containing at least one thermally conductive filler selected from a group comprising alumina, silicon nitride, aluminum nitride, boron nitride, magnesium oxide, and quartz powder (Claim 5).

Since the electrostatic chuck of the present invention has superior cooling performance and insulation performance and also has a low level of particulate generation, it is suitable for processes wherein a substrate must be held during manufacture of a semiconductor integrated circuit. In particular, when used in an ion implantation process, the temperature of a wafer can be kept uniform and constant, and ion implantation can be performed smoothly without causing heat damage to the wafer.

DESCRIPTION OF THE PREFERRED EMBODIMENTS

The present invention will now be described in further detail. "Average particle size" in this invention means volume average particle size in the particle size distribution measurement by laser beam diffractometry, "hardness" is a value measured by a type A durometer which is specified in JIS K 6249, tensile strength is a value measured by the method specified to JIS K 6249, and "surface roughness" is the center line average roughness (Ra) specified in JIS B 0601-1982.

Figure 1:
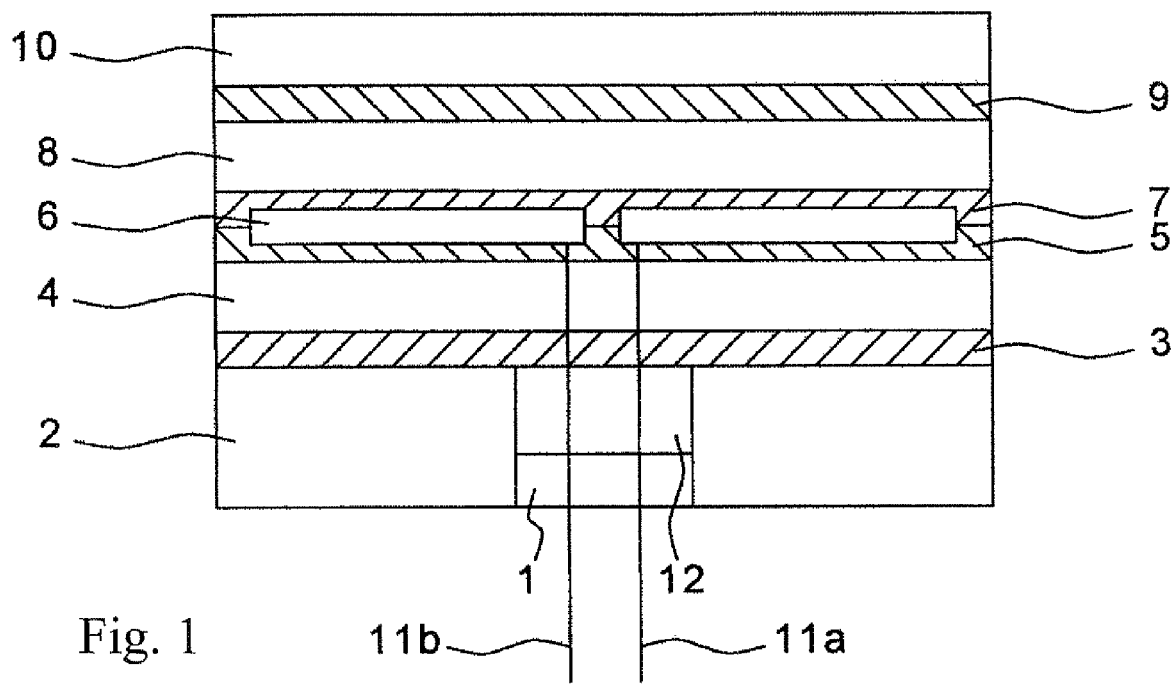
FIG. 1 is a longitudinal cross-section showing an example of the electrostatic chuck of the invention.

FIG. 1 is a longitudinal section showing an example of the electrostatic chuck of the present invention. In FIG. 1, 1 is a hole provided in the center of a metal substrate 2, and 3, 5, 7, and 9 are adhesive layers. 4 is a first insulating layer, 8 is a second insulating layer, 10 is a third insulating layer, and 6 is an electrically conducting pattern. The first insulating layer 4 is a thermally conductive silicone rubber layer provided on a disk-shaped metal substrate 2 having a hole 1 in the center via an adhesive layer 3, and the electrically conducting pattern 6 is formed as an electrode via the adhesive layer 5 on this first insulating layer 4. The electrically conducting pattern 6 is about half-embedded in the adhesive layer 5, the adhesive layer 7, the second insulating layer 8, the adhesive layer 9 and the third insulating layer 10 being formed one by one on this pattern and the exposed adhesive layer 5.

Figure 2:
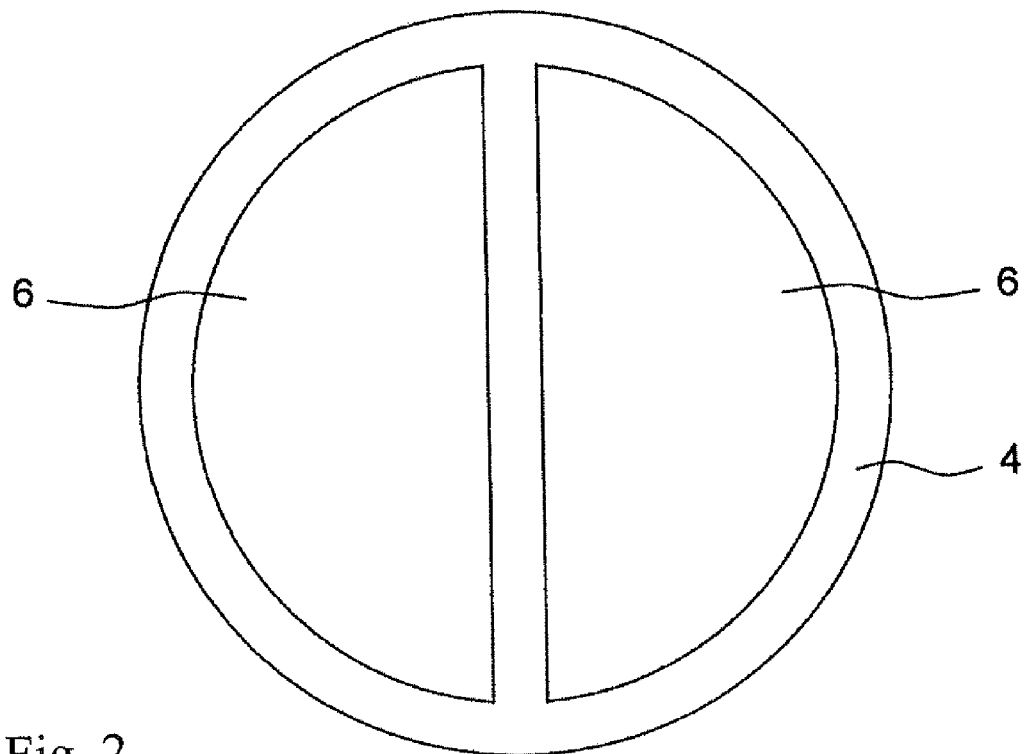
FIG. 2 is a plan view showing the electrically conducting pattern disposed on the first insulating layer used for the electrostatic chuck of FIG. 1, in a state where the adhesive layer formed on the electrically conducting pattern and the layers above it have not yet been formed.

FIG. 2 is a plan view corresponding to a state where the electrically conducting pattern 6 is disposed on the first insulating layer 4, and the adhesive layer 7 and upper layers have not yet been formed. As shown in FIG. 2, in this example, the electrically conducting pattern 6 consists of two semicircular patterns.

In FIG. 1, the second insulating layer 8 provided via the adhesive layer 7 on the electrically conducting pattern 6 is an insulating polyimide film, and the third insulating layer 10 provided via the adhesive layer 9 on this second insulating layer 8 is a silicone rubber layer with reinforcing silica. This third insulating layer 10 is a layer not containing any thermally conductive filler having an average particle size of 0.5 µm or more, and preferably, it has a hardness of 50 or more, a tensile strength of 5 MPa or more, and a surface roughness of 5 µm or less.

The lead wires 11a, 11b from each of the two electrically conducting patterns 6 pass through the adhesive layer 5, the first insulating layer 4, and the adhesive layer 3, and are pulled out through the hole 1 in the center of the metal substrate 2. The lead wires 11a, 11b are lead wires for supplying voltage from a power supply to the electrically conducting pattern 6 of the electrostatic chuck, and are connected to the electrically conducting pattern 6 by solder.

The voltage applied to the electrostatic chuck of the present invention is usually about from 0 to ±4000V, and it is applied at about from 0 to ±10 kV in an insulation performance test. Therefore, the lead wires 11a, 11b are preferably covered by a fluororesin (for example, PTFE, FEP, PFA) which has an excellent withstand voltage.

The hole 1 is preferably filled with a sealant 12 in order to secure the insulation between the metal substrate 2, the lead wires 11a, 11b and the electrically conducting pattern 6. The sealant 12 can be suitably selected from among well-known sealants, such as for example a silicone type, epoxy type and polyimide type.

Metal Substrate

The metal substrate used in the invention is preferably a metal which is not only durable, but does not pollute the semiconductor circuit by generating dust. As examples of such a metal, aluminum, alumite and duralumin may be mentioned.

First Insulating Layer

The first insulating layer is a thermally conductive silicone rubber having a thermal conductivity of 0.5 W/mK or more, preferably 1 W/mK or more, and more preferably, 3 W/mK or more. If this thermal conductivity is too low, it is difficult to suppress the rise in heat of the wafer due to the heat generated by the ion beam, so it may not be possible to keep the temperature of the wafer uniform and constant, and difficult to perform ion implantation smoothly without causing heat damage to the wafer. The thermal conductivity is preferably as high as possible provided that the properties of silicone rubber are maintained, for example, a thermally conductive silicone rubber having a thermal conductivity of about 10 W/mK can be used. The hardness and surface roughness of the thermally conductive silicone rubber used for the first insulating layer are not particularly limited.

The thermally conductive silicone rubber used for the first insulating layer is preferably a cured product of a silicone rubber composition containing a thermal conductive filler. The silicone rubber composition prior to curing may be a millable silicone rubber composition or a liquid silicone rubber composition. The silicone rubber composition prior to curing may also be for example a peroxide curing type, an addition reaction curing type, a condensation curing type or an ultraviolet curing type silicone rubber composition, but it is not limited thereto. In the invention, among these types, a peroxide curing type or an addition reaction curing type silicone rubber composition is preferred from the viewpoint of workability and moldability, and a peroxide curing type or addition reaction curing type millable silicone rubber composition is particularly preferred.

As an example of a peroxide curing type silicone rubber composition, there may be mentioned a silicone rubber composition obtained by radical polymerization and curing of an organopolysiloxane having two or more alkenyl groups such as vinyl groups bonded to a silicon atom, and more specifically, a straight-chain organopolysiloxane having an alkenyl group such as a vinyl group at one or both of a terminal portion (one or both ends) of the molecular chain, and a non-terminal portion of the molecular chain, in the presence of an organic peroxide.

As an example of an addition reaction curing type silicone rubber composition, there may be mentioned a silicone rubber composition obtained by a reaction (hydrosilylation addition reaction) of the above-mentioned straight-chain organopolysiloxane containing an alkenyl group with an organohydrogen polysiloxane in the presence of a platinum metal catalyst, and curing.

As an example of a condensation curing type silicone rubber composition, there may be mentioned a silicone rubber composition obtained by reaction of an organopolysiloxane capped with silanol groups at both ends, with a hydrolysable silane such as a tetraalkoxysilane and/or its partial hydrolysis condensation product, in the presence of a condensation catalyst such as an organotin catalyst, and curing, or a silicone rubber composition obtained by reaction of an organopolysiloxane capped with an alkoxy group-containing siloxy group or alkoxy group-containing siloxyakyl group such as trialkoxysiloxy, dialkoxyorganosiloxy, trialkoxysiloxyethyl, or dialkoxyorganosiloxyethyl, in the presence of a condensation catalyst such as an organotin catalyst, and curing.

As an example of an ultraviolet curing silicone rubber composition, there may be mentioned a silicone rubber composition cured by the energy of ultraviolet rays having a wavelength of 200-400 nm. In this case, the curing mechanism is not particularly limited. Specific examples are an acrylic silicone type silicone rubber composition comprising an organopolysiloxane having an acryl group or methacryl group and a photopolymerization initiator, a mercaptovinyl addition condensation type silicone rubber composition comprising an organopolysiloxane having a mercapto group, an organopolysiloxane having an alkenyl group such as a vinyl group and a photopolymerization initiator, an addition reaction type silicone rubber composition using the same platinum group metal catalyst as the thermosetting addition reaction type, and a cationic polymerization type silicone rubber composition comprising an organopolysiloxane having an epoxy group and an onium salt catalyst. All of these can be used as ultraviolet curing type silicone rubber compositions.

As an example of a thermal conductive fillers which imparts thermal conductivity to silicone rubber, alumina, silicon nitride, aluminum nitride, boron nitride, magnesium oxide, and quartz powder may be mentioned. These thermal conductive fillers may be used independently, or two or more may be used together.

An additive such as a reinforcing filler (for example, silica etc.), a colorant, a thermal stabilizer and a fire-retardant, may be further blended with the thermally conductive silicone rubber of the first insulating layer. These may be used independently, or two or more may be used together.

The thickness of the first insulating layer is preferably 50-1000 µm, and more preferably 300-800 µm. If the thickness is within this range, the withstand voltage of the first insulating layer is maintained, so the possibility that a dielectric breakdown will occur in the electrostatic chuck is not only lower, but the heat dissipation properties of the electrostatic chuck are very satisfactory.

The first insulating layer is formed directly on a metal substrate, or is formed (laminated) on the metal substrate via an adhesive layer as shown in FIG. 1. In the former case, it is sufficient if the first insulating layer is made to adhere directly to the metal substrate. The adhesive layer provided in the latter case preferably contains an adhesive such as a silicone rubber adhesive or acrylic adhesive, a primer containing a silane coupling agent or a titanium coupling agent etc. In this case, the first insulating layer is made to adhere to the metal substrate by these adhesives or primers.

The thickness of the adhesive layer is preferably within the range of 0.1-30 µm. If the thickness is within this range, the heat dissipation properties of the electrostatic chuck are very satisfactory without lowering the thermal conductivity of the adhesive layer.

Thermally conductive fillers, such as alumina, silicon nitride, aluminum nitride, boron nitride, magnesium oxide, and quartz powder, may be blended with the adhesive layer in order to improve thermal conductivity. These thermal conductive fillers may be used independently, or two or more may be used together.

Electrically Conducting Pattern

The electrically conducting pattern functions as an electrode when the electrostatic chuck adsorbs a wafer. The material of the pattern may be a metal such as copper, aluminum, nickel, silver or tungsten, or an electrically conducting ceramic material such as titanium nitride.

The thickness of the electrically conducting pattern is preferably 1-100 µm, and more preferably 10-50 µm. If the thickness is within this range, the mechanical strength of the conductive pattern is satisfactory, so damage to the electrically conducting pattern during the process of laminating the second insulating layer and third insulating layer and the process of joining the lead wires for supplying voltage to the electrically conducting pattern by soldering, can be prevented. In addition, the mechanical strength and electrical performance of the electrically conducting pattern can be maintained without unnecessarily thickening the pattern, which is advantageous also from the viewpoint of material cost.

The electrically conducting pattern may be a single electrode type, or may be a multi-electrode type. As an example of a electrode type electrically conducting pattern, the bipolar electrically conducting pattern shown in FIG. 2 may be mentioned.

The electrically conducting pattern is formed directly on the first insulating layer, or may be formed (laminated) via an adhesive layer on the first insulating layer as shown in FIG. 1.

The ingredients and thickness of the adhesive layer may be identical to those of the adhesive layer between the metal substrate and the first insulating layer.

Second Insulating Layer

The second insulating layer is an insulating polyimide film. Due to the presence of this second insulating layer, even when a sputter metal is introduced between the chuck and the wafer, the occurrence of insulation defects can be suppressed. As examples of the above-mentioned insulating polyimide film, Kapton (product name, Toray-du Pont Ltd.), Apical (product name, Kaneka Corp.), and UPILEX (product name, Ube Industries, Ltd.), may be mentioned.

The thickness of the second insulating layer is preferably 5-50 µm, and more preferably 7.5-25 µm. If the thickness is within this range, the withstand voltage of the second insulating layer is maintained, so there is less possibility that the electrostatic chuck will suffer a dielectric breakdown, and the heat dissipation properties of the electrostatic chuck are also very satisfactory. The above-mentioned second insulating layer is formed directly on the electrically conducting pattern, or is formed (laminated) on the electrically conducting pattern via an adhesive layer as shown in FIG. 1. The ingredients and thickness of the adhesive layer may be identical to those of the adhesive layer provided between the metal substrate and the first insulating layer.

Third Insulating Layer

The third insulating layer comprises a silicone rubber blended with reinforcing silica. Due to this third insulating layer, generation of particulates when the electrostatic chuck of the invention comes in contact with a wafer can be suppressed. The above-mentioned silicone rubber blended with reinforcing silica used for the third insulating layer must not contain any thermally conductive filler having an average particle size of 0.5 µm or more, and preferably not contain any thermally conductive filler having an average particle size of 0.2 µm or more. If it contains a thermally conductive filler having an average particle size of 0.5 µm or more, there is concern that dropouts may occur when it comes in contact with and rubs against a wafer, generating particulates. The hardness of the third insulating layer is usually 50 or more, and preferably 60-95. If the hardness is lower than 50, surface tackiness is stronger and there is a possibility that rubber may be transferred to a wafer. The tensile strength is usually 5 MPa or more, and preferably 6-15 MPa. If it is less than 5 MPa, the strength of the rubber is insufficient, and there is a possibility that the rubber may break due to repeated adsorption of a wafer.

The surface roughness of the silicone rubber blended with reinforcing silica used for the third insulating layer provided by this invention is usually 5 µm or less, and is preferably 2 µm or less. If the surface roughness is larger than 5 µm, adhesion between the third insulating layer and the wafer decreases and the contact thermal resistance at the interface therebetween increases, so it may not be possible to keep the temperature of the wafer uniform and constant.

As an example of a silicone rubber composition prior to curing, one of a millable silicone rubber composition and a liquid silicone rubber composition may be used as in the case of the first insulating layer. Further, as an example of a silicone rubber composition prior to curing, a peroxide curing type, an addition reaction curing type, a condensation curing type, an ultraviolet curing type silicone rubber composition may be mentioned, but the composition is not limited thereto. Among these, from the viewpoint of workability and moldability, a peroxide curing type or an addition reaction curing type silicone rubber composition is preferred, and a peroxide curing type or an addition reaction curing type millable silicone rubber composition is more preferred.

The filler which imparts reinforcing properties to the silicone rubber may be for example a fumed silica (dry silica) or a precipitated silica (wet silica), but in the present invention, a fumed silica (dry silica) with few impurities is preferred. The reinforcing silica preferably has a specific surface area measured by the BET method of 50 $m^2/g$ or higher, and more preferably 100-400 $m^2/g$. The surface of the reinforcing silica may be given a hydrophobic treatment by an organopolysiloxane, organosilazane, chlorosilane or alkoxysilane.

An additive such as a known colorant, thermal stabilizer and fire-retardant may be added to the silicone rubber blended with the reinforcing silica. These may be used independently, or two or more may be used together.

Since the silicone rubber blended with reinforcing silica used for the third insulating layer comes in direct contact with wafers, it is preferable that electrically conducting impurities, for example, alkali metals, alkaline-earth metals, heavy metals such as copper, iron, chromium and nickel and compounds thereof are excluded as far as possible so that the wafers are not contaminated. Specifically, the content of electrically conducting impurities is preferably 1 ppm or less based on mass converted into metal elements.

The thickness of the third insulating layer is preferably 10-150 µm, and more preferably 20-80 µm. If the thickness is within this range, the mechanical strength of the third insulating layer is maintained, so particles generated by contact with or rubbing against a wafer can be suppressed. If it is thicker than 150 µm, thermal conductivity decreases, and the heat dissipation properties of the electrostatic chuck may not be satisfactory.

The third insulating layer is formed directly on the second insulating layer, or is formed (laminated) via an adhesive layer on the second insulating layer as shown in FIG. 1. The ingredients and thickness of the adhesive layer may be the same as those of the adhesive layer between the metal substrate and the first insulating layer.

Adhesive Layer

As indicated in the description of the insulating layers and the electrically conducting pattern, the adhesive layer between the metal substrate and the first insulating layer, the adhesive layer between the first insulating layer and the electrically conducting pattern, the adhesive layer between the electrically conducting pattern and the second insulating layer, and the adhesive layer between the second insulating layer and the third insulating layer, when these layers are formed, respectively contain an adhesive such as a silicone rubber or an acrylic adhesive, or a primer containing a silane coupling agent or titanium coupling agent, and they preferably have a thickness within a range of 0.1-30 µm. If the thickness is within this range, the heat dissipation properties of the electrostatic chuck are very satisfactory without impairing the thermal conductivity of the adhesive layer. A thermal conductive filler, such as alumina, silicon nitride, aluminum nitride, boron nitride, magnesium oxide or quartz powder, may be blended with the adhesive layer to improve thermal conductivity. These thermal conductive fillers may be used independently, or two or more may be used together.

Hereafter, the invention will be described referring to specific examples and comparative examples, but it will be understood that the invention is not to be construed as being limited in any way thereby.

EXAMPLE 1

The electrostatic chuck having the structure shown in FIG. 1 was produced as follows.

Primer No. 24T (product name, Shin-Etsu Chemical Co., Ltd.) as an adhesive was applied to one side of an electrolytic copper foil (thickness 35 μm) using a brush, and was air-dried for 30 minutes at room temperature to obtain the adhesive layer 5 (thickness 10 μm). The adhesive layer 5 and the first insulating layer 4 comprising an unvulcanized sheet of thermally conductive silicone rubber TC-65BG (product name, Shin-Etsu Chemical Co., Ltd. thickness 650 μm, thermal conductivity 4 W/mK) containing boron nitride were stuck together, and press bonding was performed for 10 minutes at a pressure of 5 MPa and temperature of 170□. Chemical etching of the electrolytic copper foil was performed, and the electrically conducting pattern 6 (copper electrode) having the shape shown in FIG. 2 was thus formed on the first insulating layer 4.

Next, the liquid silicone rubber adhesive KE1825 (product name, Shin-Etsu Chemical Co., Ltd.) was applied to the electrically conducting pattern 6 side of the above-mentioned lamination composite sheet comprising the first insulating layer 4/adhesive layer 5/electrically conducting pattern 6 by screen printing so that the thickness was 25 μm, and the adhesive layer 7 was thus obtained. The adhesive layer 7 and the second insulating layer 8 comprising a 25 μm-thick polyimide film (Kapton, product name, Toray-du Pont Co., Ltd.) were stuck together, press bonding was performed at a pressure of 4 MPa and a temperature of 120□ for 10 minutes, and a laminated composite sheet comprising the first insulating layer 4/adhesive layer 5/electrically conducting pattern 6/adhesive layer 7/second insulating layer 8 was thus produced.

Next, a primer C (product name, Shin-Etsu Chemical Co., Ltd.) as an adhesive was applied to the polyimide film (second insulating layer 8) side of the above-mentioned lamination composite sheet, air-dried for 15 minutes at room temperature, and an adhesive layer 9 (thickness 2 μm) was thus obtained. The adhesive layer 9, and a third insulating layer 10 of an unvulcanized sheet of a silicone rubber A (thickness 50 μm, the properties of cured silicone rubber A were: hardness 80, tensile strength 8.2 MPa and surface roughness 0.5 μm), which was prepared by blending 100 mass parts of an organo-polysiloxane (composition, methylvinylpolysiloxane having an average degree of polymerization of 8000 comprising 99.7 mol % of dimethylsiloxane units and 0.3 mol % of methylvinylsiloxane units) with 65 mass parts of fumed silica Aerosil 300 (product name, Japan Aerosil Co., Ltd.) having a specific surface area of 300 m$^2$/g and an average particle diameter of 0.02 μm, and 0.7 mass parts of 2,5-dimethyl-2,5-di(tert-butylperoxy)hexane, were stuck together, press bonding was performed at a pressure of 4 MPa and temperature of 170□ for 10 minutes, and a laminated composite sheet comprising the first insulating layer 4/adhesive layer 5/electrically conducting pattern 6/adhesive layer 7/second insulating layer 8/adhesive layer 9/third insulating layer 10, was thus produced.

Next, the above-mentioned liquid silicone rubber adhesive KE1825 was applied to the aluminum substrate 2 by screen printing to a thickness of 25 μm, and the adhesive layer 3 was thus obtained. The adhesive layer 3 and first insulating layer 4 side of the above-mentioned laminated composite sheet were stuck together, press bonding was performed at a pressure 3 MPa and a temperature of 120□ for 15 minutes, and a laminated composite sheet comprising the aluminum substrate 2/adhesive layer 3/first insulating layer 4/adhesive layer 5/electrically conducting pattern 6/adhesive layer 7/second insulating layer 8/adhesive layer 9/third insulating layer 10, was thus produced.

Finally, the PTFE-covered electric wires 11a, 11b were soldered to the electrically conducting pattern 6 of the above-mentioned laminated composite sheet, the hole 1 was filled by an epoxy sealant of semicoat 114A (product name, Shin-Etsu Chemical Co., Ltd.) as the sealant 12, hardened at 120□ for 5 hours, and an electrostatic chuck was thus produced.

EXAMPLE 2

Next, an electrostatic chuck was produced as in Example 1, except the conditions were changed as follows.
(1) Instead of the third insulating layer 10 comprising an unvulcanized sheet of silicone rubber A, the third insulating layer 10 of an unvulcanized sheet of a silicone rubber B (thickness 120 μm, the properties of cured silicone rubber A were: hardness 63, tensile strength 8.8 MPa and surface roughness 0.5 μm), which was prepared by blending 100 mass parts of an organo-polysiloxane (composition, methylvinylpolysiloxane having an average degree of polymerization of 8000 comprising 99.85 mol % of dimethylsiloxane units and 0.15 mol % of methylvinyl siloxane units) with 50 mass parts of fumed silica Aerosil 200 (product name, Japan Aerosil Co., Ltd.) having a specific surface area of 200 m$^2$/g, and 0.7 mass parts of 2,5-dimethyl-2,5-di(tert-butylperoxy) hexane, was used.
(2) Instead of the second insulating layer 8 comprising a 25 μm-thick polyimide film, the second insulating layer 8 comprising a 12.5 μm-thick polyimide film (Apical, product name, Kaneka Corp., Ltd.), was used.

EXAMPLE 3

Figure 3:
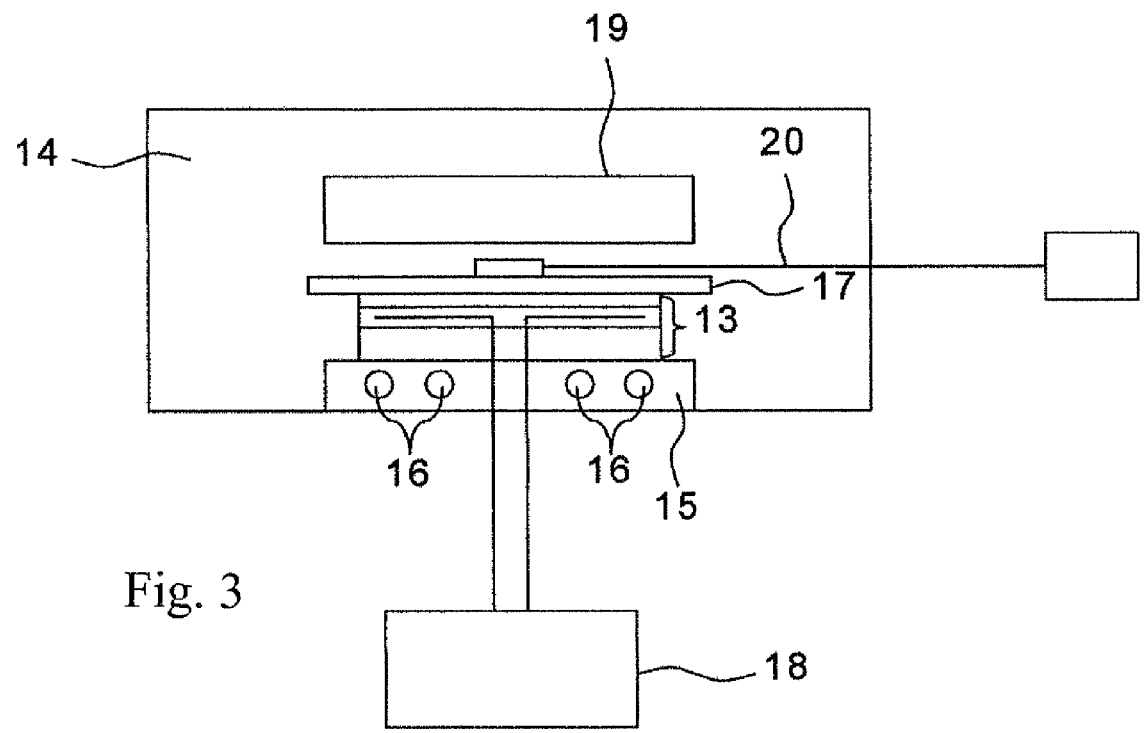
FIG. 3 is a longitudinal cross-section showing the schematic construction of a cooling performance tester used for evaluating the cooling performance of the electrostatic chuck in the examples.

An electrostatic chuck was produced as in Example 1, except that instead of the liquid silicone rubber adhesive KE1825 used for the adhesive layer 7 and adhesive layer 3, a thermally conductive silicone rubber adhesive KE1862 (product name, Shin-Etsu Chemical Co., Ltd.) was used.
Evaluation of Electrostatic Chucks of Examples 1-3
Cooling Performance The cooling performance of each of the electrostatic chucks obtained in Examples 1-3 was evaluated. A cooling performance tester was used for the evaluation. FIG. 3 is a longitudinal cross-section showing an outline of the construction of the cooling performance tester. In FIG. 3, 13 is an electrostatic chuck, 14 is a chamber, 15 is a stand, 16 are cooling tubes, 17 is a wafer, and 18 is a power supply. The electrostatic chuck 13 is mounted on the stand 15 in the chamber 14, and cooling water is circulated through the cooling tube provided on the stand 15 to cool the electrostatic chuck 13. After installing the wafer 17 on the electrostatic chuck 13, the pressure in the chamber 14 was decompressed to 0.01 Torr. Next, a direct-current voltage of ±500V was supplied to the electrostatic chuck 13 from the power supply 18, and the wafer 17 was adsorbed and fixed on the electrostatic chuck 13.

Figure 4:
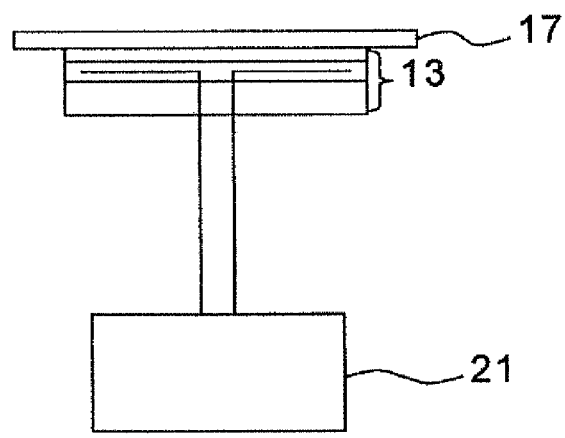
FIG. 4 is a longitudinal cross-section showing the schematic construction of a withstand voltage tester used for evaluating the insulation performance of the electrostatic chuck in the examples.

Next, the wafer 17 was heated to 150□ using the heater 19, and cooling water at 5□ was circulated through the cooling tubes 16. When the temperature of the wafer 17 reached equilibrium, the temperature of the wafer 17 surface was measured using a surface thermometer 20. Table 1 shows the results.
Insulation Performance The insulation performance of each of the electrostatic chucks obtained in Examples 1-3 was evaluated. A withstand voltage tester was used for evaluation. FIG. 4 is a longitudinal cross-section showing an outline of the construction of a withstand voltage tester. As shown in FIG. 4, after connecting the electrostatic chuck 13 with a power supply 21 and installing the wafer 17 on the electrostatic chuck 13, a direct-current voltage of +10 kV was applied for 10 minutes, and it was observed whether or not a dielectric breakdown occurred. Table 1 shows the results.

Level of Particulates

The level of particulate generation was evaluated for each of the electrostatic chucks obtained in Examples 1-3. An ion implantation device was used for the evaluation. The electrostatic chuck was installed in the ion implantation device, and ion implantation was performed to an 8-inch wafer under the conditions of adsorption voltage ±1200 V, injected heat 0.5 W/cm$^2$, dose amount 5×10$^{15}$ ions/cm$^2$, and implantation time 500 seconds. It was found that satisfactory ion implantation could be performed while maintaining the temperature of the wafer at 60□. A quantitative analysis of the adhesion amount of metal impurities to the wafer was performed by total reflection fluorescence X ray analysis. At every measurement point, metal impurities (Cu, Fe, Cr, Al, Na, Ni etc.) were less than 5×10$^{10}$ atoms/cm$^2$ which was satisfactory. The number of particles of 0.16 μm or more adhering to the wafer back side was measured by a particle counter. Table 1 shows the results.

COMPARATIVE EXAMPLE 1

An electrostatic chuck was produced as in Example 1, except that instead of the silicone rubber A used as the third insulating layer 10, a thermally conductive silicone rubber TC-20A (product name, Shin-Etsu Chemical Co., Ltd., thickness 200 μm, hardness 70, thermal conductivity 1.1 W/mK, surface roughness 1 μm) with which alumina having an average particle size of 4 μm was blended, was used.

COMPARATIVE EXAMPLE 2

An electrostatic chuck was produced as in comparative example 1, except that the second insulating layer 8 and adhesive layer 7 were not formed. In this case, instead of applying the primer C to the polyimide film (second insulating layer 8) side of the laminated composite sheet comprising the first insulating layer 4/adhesive layer 5/electrically conducting pattern 6/adhesive layer 7/second insulating layer 8, it was applied to the electrically conducting pattern 6 side of a laminated composite sheet comprising the first insulating layer 4/adhesive layer 5/electrically conducting pattern 6, and the second insulating layer 8 and adhesive layer 7 were not formed.

The cooling performance, insulation performance and level of particulate generation of the electrostatic chucks of comparative examples 1 and 2 were evaluated in the same way as for the electrostatic chucks of Examples 1-3. Table 2 shows the results.

TABLE 1

|  | Example 1 | Example 2 | Example 3 |
| --- | --- | --- | --- |
| Structure of electrostatic chuck | | | |
| 3rd insulating layer 10 | Silicone rubber A | Silicone rubber B | Silicone rubber A |
| Thickness (μm) | 50 | 120 | 50 |
| Hardness | 80 | 63 | 80 |
| Tensile strength (MPa) | 8.2 | 8.8 | 8.2 |
| Surface roughness (μm) | 0.5 | 0.5 | 0.5 |
| Adhesive layer 9 | Primer C | Primer C | Primer C |
| 2nd insulating layer 8 | Polyimide film (Kapton) | Polyimide film (Apical) | Polyimide film (Kapton) |
| Thickness (μm) | 25 | 12.5 | 25 |
| Adhesive layer 7 | KE1825 | KE1825 | KE1862 |
| Electrically conducting pattern 6 | Electrolytic copper foil | Electrolytic copper foil | Electrolytic copper foil |
| Thickness (μm) | 35 | 35 | 35 |
| Adhesive layer 5 | Primer No. 24T | Primer No. 24T | Primer No. 24T |
| 1st insulating layer 4 | TC-65BG | TC-65BG | TC-65BG |
| Thickness (μm) | 650 | 650 | 650 |
| Thermal conductivity (W/mK) | 4 | 4 | 4 |
| Adhesive layer 3 | KE1825 | KE1825 | KE1862 |
| Metal substrate 2 | Aluminum | Aluminum | Aluminum |
| Leads 11a, 11b | PTFE covered cable | PTFE covered cable | PTFE covered cable |
| Sealant 12 | Semicoat 114A | Semicoat 114A | Semicoat 114A |
| Measurement results | | | |
| Wafer surface temperature (□) | 59 | 62 | 56 |
| Occurrence of dielectric breakdown (for ±10 kV direct voltage and 10 minutes) | No dielectric breakdown | No dielectric breakdown | No dielectric breakdown |
| Number of particles | 4360 | 3950 | 3720 |

TABLE 2

|  | Comparative example 1 | Comparative example 2 |
| --- | --- | --- |
| Structure of electrostatic chuck | | |
| 3rd insulating layer 10 | TC-20A | TC-20A |
| Thickness (μm) | 200 | 200 |
| Hardness | 70 | 70 |
| Thermal conductivity (W/mK) | 1.1 | 1.1 |
| Surface roughness (μm) | 1 | 1 |
| Adhesive layer 9 | Primer C | Primer C |
| 2nd insulating layer 8 | Polyimide film (Kapton) | — |
| Thickness (μm) | 25 | |
| Adhesive layer 7 | KE1825 | — |
| Electrically conducting pattern 6 | Electrolytic copper foil | Electrolytic copper foil |
| Thickness (μm) | 35 | 35 |
| Adhesive layer 5 | Primer No. 24T | Primer No. 24T |
| 1st insulating layer 4 | TC-65BG | TC-65BG |
| Thickness (μm) | 650 | 650 |
| Thermal conductivity (W/mK) | 4 | 4 |
| Adhesive layer 3 | KE1825 | KE1825 |
| Metal substrate 2 | Aluminum | Aluminum |
| Leads 11a, 11b | PTFE covered cable | PTFE covered cable |
| Sealant_12 | Semicoat 114A | Semicoat 114A |
| Measurement results | | |
| Wafer surface temperature (□) | 56 | 52 |
| Occurrence of dielectric breakdown (for ±10 kV direct voltage and 10 minutes) | No dielectric breakdown | Dielectric breakdown in 3$^{rd}$ insulating layer 10 |
| Number of particles | 23680 | 25120 |

Evaluation

It was found that there was no significant difference in the cooling performance of the electrostatic chucks of the Examples and the electrostatic chuck of comparative example 2, and the electrostatic chuck of the invention had excellent cooling performance although it had more insulating layers than that of comparative example 2.

On the other hand as regards insulation performance, as shown by Table 1, whereas in the electrostatic chucks of the examples dielectric breakdown did not occur, in the electrostatic chuck of comparative example 2, dielectric breakdown occurred in the third insulating layer. From this, it was confirmed that the electrostatic chuck of the invention has excellent insulation performance.

In evaluating generation of particulates, as shown in Table 1, whereas in the electrostatic chucks of the Examples, there were small amount of particulates, in the electrostatic chucks of comparative examples 1 and 2, there were many more particles. From this, it was confirmed that the electrostatic chuck of the invention had an excellent low level of particulate generation.

INDUSTRIAL APPLICABILITY

Since the electrostatic chuck of the invention has excellent cooling performance, insulation performance and low level of particulate generation, it is particularly useful in an ion implantation process for a wafer.

What is claimed is:

1. An electrostatic chuck, comprising:
a metal substrate, a first insulating layer of silicone rubber formed directly or via an adhesive layer on said metal substrate and having a thermal conductivity of 0.5 W/mK or more, an electrically conducting pattern formed directly or via an adhesive layer on said first insulating layer, a second insulating layer of an insulating polyimide film formed directly or via an adhesive layer on said electrically conducting pattern, and a third insulating layer formed directly or via an adhesive layer on said second insulating layer,
wherein said third insulating layer is a silicone rubber containing reinforcing silica, said third insulating layer not containing any thermally conductive filler having an average particle size of 0.5 μm or more.

2. The electrostatic chuck according to claim 1, wherein said third insulating layer is a layer having a thickness of 10-150 μm, and containing fumed silica (dry silica) having a BET specific surface area of more than 50 m²/g.

3. The electrostatic chuck according to claim 1, wherein said third insulating layer has a hardness of 50 or more, a tensile strength of 5 MPa or more, and a surface roughness of 5 μm or less.

4. The electrostatic chuck according to claim 2, wherein said third insulating layer has a hardness of 50 or more, a tensile strength of 5 MPa or more, and a surface roughness of 5 μm or less.

5. The electrostatic chuck according to claim 1, wherein the thickness of said second insulating layer is 5-50 μm.

6. The electrostatic chuck according to claim 1, wherein at least one of said adhesive layers is provided, said adhesive layer containing at least one thermally conductive filler selected from a group consisting of alumina, silicon nitride, aluminum nitride, boron nitride, magnesium oxide, and quartz powder.

7. The electrostatic chuck according to claim 1, wherein said metal substrate is aluminum, alumite, or duralumin.

8. The electrostatic chuck according to claim 1, wherein said first insulating layer is a thermally conductive silicone rubber having a thermal conductivity of 1 W/mK or more.

9. The electrostatic chuck according to claim 1, wherein said first insulating layer is a thermally conductive silicone rubber having a thermal conductivity of 3 W/mK or more.

10. The electrostatic chuck according to claim 1, wherein said first insulating layer is a cured product of a silicone rubber composition containing a thermal conductive filler selected from alumina, silicon nitride, aluminum nitride, boron nitride, magnesium oxide, quartz powder, and combinations thereof.

11. The electrostatic chuck according to claim 1, wherein the thickness of the first insulating layer is 50-1000 μm.

12. The electrostatic chuck according to claim 1, wherein the material of said electrically conducting pattern is copper, aluminum, nickel, silver, tungsten, or titanium nitride, and the thickness of the electrically conducting pattern is 1-100 μm.

13. The electrostatic chuck according to claim 1, wherein said first second insulating layer is an insulating polyimide film.

14. The electrostatic chuck according to claim 1, wherein said third insulating layer does not contain any thermally conductive filler having an average particle size of 0.2 μm or more.

15. The electrostatic chuck according to claim 1, wherein the hardness of said third insulating layer is 60-95, the tensile strength of said third insulating layer is 6-15 MPa, and the surface roughness of said third insulating layer is 2 μm or less.

16. The electrostatic chuck according to claim 1, wherein silica has a specific surface area measured by the BET method of 100-400 m²/g.

17. The electrostatic chuck according to claim 1, wherein the thickness of said third insulating layer is 10-150 μm.

18. The electrostatic chuck according to claim 1, wherein said adhesive layers, if present, each have a thickness of 0.1-30 μm, and contain a silicone rubber adhesive, an acrylic adhesive, or a primer containing a silane coupling agent or titanium coupling agent.

19. The electrostatic chuck according to claim 1, wherein
said first insulating layer is a thermally conductive silicone rubber having a thickness 50-1000 μm;
the material of said electrically conducting pattern is copper, aluminum, nickel, silver, tungsten, or titanium nitride, and the thickness of the electrically conducting pattern is 1-100 μm;
said second insulating layer is an insulating polyimide film having a thickness of 5-50 μm;
said third insulating layer has a thickness of 10-150 μm and contains fumed silica (dry silica) having a BET specific surface area of more than 50m²/g; and
said adhesive layers, if present, each have a thickness of 0.1-30 μm, and contain a silicone rubber adhesive, an acrylic adhesive, or a primer containing a silane coupling agent or titanium coupling agent.

* * * * *